United States Patent [19]

Toledo et al.

[11] 3,999,174

[45] Dec. 21, 1976

[54] DISCONTINUOUS CHROMIUM FILM FOR MEMORY ELEMENT

[75] Inventors: Emil Toledo, Newton; Marden H. Seavey, Jr., Westford; Joseph P. McNamara, Hudson, all of Mass.

[73] Assignee: The United States of America as represented by the Secretary of the Navy, Washington, D.C.

[22] Filed: Sept. 19, 1975

[21] Appl. No.: 614,826

[52] U.S. Cl. .................... 340/174 PW; 29/195; 204/28; 427/131; 427/132; 428/389; 428/469
[51] Int. Cl.² .................................. G11C 11/02
[58] Field of Search .......... 340/174 PW; 29/195 Y

[56] References Cited

UNITED STATES PATENTS 3,451,793  6/1969  Matsushita .............. 340/174 PW
3,866,192  2/1975  Ulmer ..................... 340/174 PW Primary Examiner—Thomas B. Habecker
Attorney, Agent, or Firm—R. Sciascia; R. Beers; S. Sheinbein

[57] ABSTRACT

A method with wide process margins for producing a plated-wire memory element with both good unipolar disturb resistance and burst read resistance. The method comprises adding the additional process step of dipping the wire after the first permalloy layer or a portion thereof has been plated into a bath of a chromium chloride solution so that a thin, discontinuous chromium chloride film overlays this inner permalloy layer. The rest of the first permalloy layer (mated-film process) or the second permalloy layer (mated-film process) may then be plated over this chromium chloride film.

4 Claims, 2 Drawing Figures

DISCONTINUOUS CHROMIUM FILM FOR MEMORY ELEMENT

It should be understood that the foregoing abstract of the disclosure is for the purpose of providing a non-legal brief statement to serve as a searching-scanning tool for scientists, engineers and researchers and is not intended to limit the scope of the invention as disclosed herein nor is it intended that it should be used in interpreting or in any way limiting the scope of fair meaning of the appended claims.

FIELD OF INVENTION

The present invention relates generally to plated, magnetic, memory wire and more particularly to a non-destructive read-out mated-wire element with substantially enlarged operating margins.

DESCRIPTION OF THE PRIOR ART

The ability to utilize thin magnetic films for fast memories, of reduced size and of large storage capacity, results from the fact that such films are capable of assuming different stable magnetic states and of transferring from one state to the other in a very short time, of the order of a few nanoseconds, by undergoing a reversal of the magnetization. These films are usually obtained by depositing a ferromagnetic material on a substrate by electrolytic means or by evaporation under vacuum, the deposition occurring in the presence of an orienting magnetic field in order to provide a uniaxial anisotropy of magnetization; i.e., a direction, termed the easy axis, along which, when the orienting field is removed, the magnetization of the film remains preferentially oriented.

FIG. 1 is an enlarged perspective view of a magnetic thin-film plated-wire memory element 10. By way of example, the memory element 10 is comprised of a magnetic film 12 that is electroplated on a 5 mil diameter beryllium-copper wire 13. As noted above, the magnetic film 12 is continuous and is electroplated in the presence of a circumferential magnetic field (caused by running a current in the wire 12 during the plating operation) that establishes a magnetic anisotropy axis, or preferred magnetization direction 14, circumferentially around the memory element 10. Information is then stored in accordance with the sense of the magnetization vector around the circumference of the plated wire. A clockwise magnetization represents a one and a counterclockwise magnetization represents a zero stored.

In operation, an information bit is written into the memory element by applying a word current 18 to the word strap 16 which envelops the memory element 10 at right angles and produces a word field along the axis of the memory element. This word field tilts the magnetization vector from its circumferential rest position towards the longitudinal direction of the memory element 10. The occurrence of the word current 18 in the word strap 16 is immediately followed by a bit current pulse 20 of the appropriate polarity so that the magnetization vector continues to rotate until it is antiparallel to the previously stored circumferential direction. Thus, when the bit current 20 flows in one direction, the magnetization is rotated such that upon release of the bit and word currents, the vector is in the one rest position and, likewise, when the bit current flows in the opposite direction, the vector rotates so that it is in the zero position.

The read operation is accomplished by applying a word current through the word strap 16 so that the word field tilts the magnetization vector toward the axis of the memory element 10. The resulting flux and voltage changes at the ends of the memory element 10 are such that one output polarity occurs for a stored one and the opposite output polarity occurs for a stored zero.

The effectiveness of a plated-wire memory element depends on its ability to produce a high signal output in response to read out impulses but which retains the level of the stored magnetic information unchanged after long periods of repeated read-out operations. This latter property is termed nondestructive read-out, usually referred to as NDRO. In order to maintain a good NDRO a bipolar write technique is commony utilized. This technique comprises applying a word current on the word strap and during its occurrence applying first a bit current pulse of the opposite polarity to that desired, and then applying a second bit current pulse with the proper polarity so that the desired digit is written into memory. The use of this technique is necessitated by the fact that the magnetic domains never align themselves perfectly uniformly in the circumferential direction of the memory element during the plating process. Thus, although most of the domains will be properly aligned circumferentially, there will always be a small proportion that align at a variety of angles to the circumferential direction. When a bit current pulse is applied down the memory wire in order to effect a bit write-in for a bit element on the memory wire, other bits on the same memory wire will have a small portion of their fluxes switched to an antiparallel magnetization direction. This slight flux switching is due to the domain misalignments. For example, if a bit current is applied which causes the flux magnetization vector to rotate by 60° in all of the bits along the memory wire, then any domains which are initially misaligned by 30° or more will be switched 90° or more to the circumferential direction. When the bit current is removed the flux vector will either not know in which direction to rotate back (the 90° situation) or will rotate to the position antiparallel to the direction of the main flux magnetization vector. At this point there is an antiparallel flux field which will aid additional misaligned flux in switching to the antiparallel direction. This process continues to build up this antiparallel flux field for each consecutive bit current pulse of the same polarity.

In order to solve the foregoing problem each bit current pulse is generally prefaced by a bit current pulse of an opposite polarity to cancel any flux switching that has taken place.

Memory systems in military installations are generally required to withstand a variety of worst-case conditions. In the case of memory wire, the worst-case condition comprises the application of one or more significant current pulses of the same polarity which, for example, might conceivably be caused by transient current phenominum due to severe radiation levels. In such a situation there would clearly be no opportunity for the application of opposite polarity cancelling pulses. In order to prevent information loss in such a situation it is desired to impede to some extent the switching facility of the bit.

The term unipolar disturb resistance (UPD) is generally used to describe the difficulty (the amount of energy required) in switching the magnetization vector in the memory bit in the wire. A high UPD denotes the ability to withstand consecutive unipolar current pulses without switching the magnetization vector. It is known that increasing the roughness of the surface of the magnetic film increases the UPD of that film. This is due to the fact that a rough surface has more pinning centers and thus more energy in the domain walls which must be operated on before it can be switched. But this same surface roughness causes gross non-alignment (dispersion) of the domains in the circumferential direction which, of course, increases domain distributions at high non-alignment angles. This, then, increases the unwanted flux switching.

Increasing the surface roughness of the film and thus its dispersion, since it decreases the amount of magnetization vector rotation, also must decrease the amount of signal obtained during a read operation. The term "burst read resistant" is used to denote this property. From the above it can be seen that a low burst read resistance is desired.

Various attempts have been made to compromise these two competing properties by varying the plating process. One of the more successful of these plating process variations is disclosed in the U.S. Pat. No. 3,736,576 by Emil Toledo. Therein, two permalloy layers, an underlying high $H_k$ layer with excellent NDRO properties and a low $H_k$ layer with an easily tilted magnetic field for increased readout signal magnitude, are plated around a wire base (mated-film process).

Though the process disclosed in U.S. Pat. No. 3,736,576 produces a wire of adequate quality, operating margins with respect to the burst read resistance and the UPD resistance are not adequate for a reliable production which will meet military specifications. Under optimum conditions the plated wire just meets the requirement of a memory wire with both a high UPD and a suitable burst read resistance. But a very slight increase in roughness causes the wire to fail the burst read resistance requirement while a very slight decrease causes the wire to fail the UPD requirement.

The present invention provides a plating method which substantially widens the above-mentioned margins. More specifically, a substantial decrease in dispersion and burst read resistance is obtained through this process without the normally concomitant substantial increase in the UPD resistance.

SUMMARY OF THE INVENTION

Briefly, the present invention achieves the foregoing by adding the additional step in a wire plating process of applying a discontinuous layer of chromium chloride, by means of a chromium chloride solution over the rough surface of the first permalloy layer or a portion thereof overlaying a non-magnetic substrate before the remaining portion of the first permalloy (mono-film process) or a second permalloy layer (mated-film process) are plated on to the wire. This creation of small islands of chromium chloride between two layers of permalloy has the effect of substantially decreasing the dispersion and thus the burst read resistance without substantially increasing the UPD resistance.

OBJECTS OF THE INVENTION

An object of the present invention is to substantially increase the operating margins of an NDRO memory element.

A further object of the present invention is to decrease the dispersion and burst read resistance of a plated-wire memory element without substantially increasing the UPD resistance.

Other objects, advantages, and novel features of the present invention will become apparent from the following detailed description of the invention when considered in conjunction with the accompanying drawings.

DETAILED DESCRIPTION OF THE INVENTION

The present invention resides in the discovery that by forming a thin non-continuous layer of chromium chloride between an inner permalloy layer and an outer permalloy layer a substantial improvement in dispersion and burst read properties are obtained. Although this improvement is accompanied by a slight decrease in the unipolar disturb resistance, the order of this decrease relative to the order of the improvement in the dispersion and burst read properties is only nominal. In any event a slight roughening of the substrate will compensate for this UPD decrease. Thus, the net result is both an NDRO wire element with superior dispersion, UPD, and burst read properties and a manufacturing process with greater margins of tolerance.

The above-described discovery appears to be extremely significant in that the addition of most discontinuous layers of a metal compound or even other chromium compounds such as chromic acid between the two permalloy layers result in an improvement in the UPD at the expense of an equivalent increase in the dispersion and burst read resistance properties. The actual reduction of the UPD (slightly) and the substantial increase in the dispersion and burst read properties with the addition of a discontinuous layer of chromium chloride was completely unexpected.

There are a variety of methods and devices which may be utilized to plate the permalloy layers on the wire substrate. By way of example of such a method, the patent disclosure of Emil Toledo U.S. Pat. No. 3,736,576 is hereby incorporated by reference into the present disclosure.

Therein is disclosed apparatus and the various solutions which were utilized to form the permalloy layers.

Figure 1:
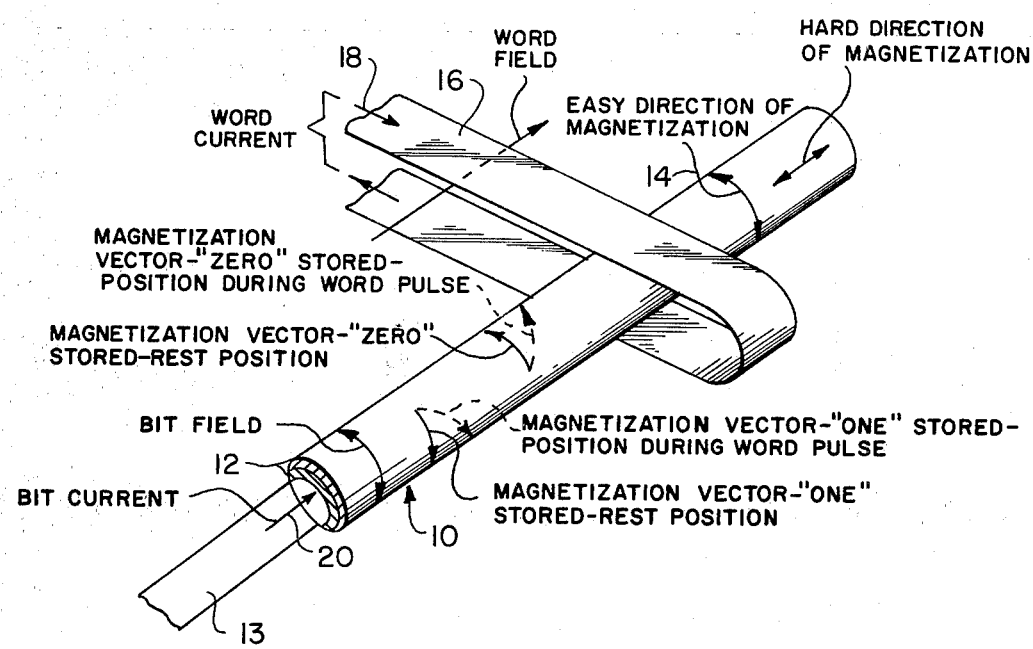
FIG. 1 is a perspective view of a typical mated, plated-wire memory element.
Figure 2:
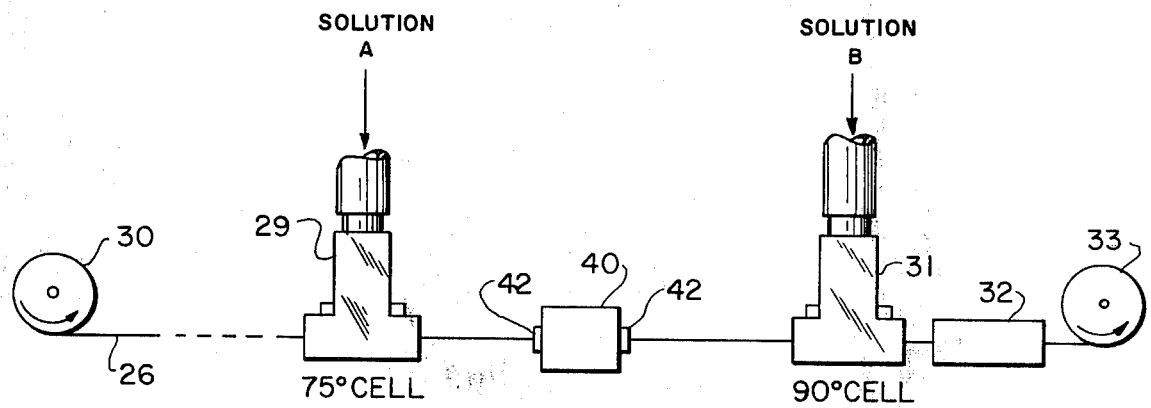
FIG. 2 is a schematic view showing plating system of U.S. Pat. No. 3,736,576 incorporating the chromium compound bath of the present invention.

The present invention may be reduced to practice in the context of the Toledo disclosure merely by inserting a four-inch long chromium-compound bath 40 in between the plating cells 29 and 31 of Toledo's FIG. 6. This is shown in FIG. 2 wherein wire 26 is pulled from a reel 30, and, after being appropriately electropolished and copper plated, is pulled through the cell 29. The wire 26 receives a plating of magnetic material (solution A in Toledo) with a high anistropic field characteristic. Upon exiting the cell 29 the wire is pulled through the aforementioned chromium bath 40 having a set of two bushings 42 at each end to minimize leakage of the chromium solution. From there the wire is pulled through the second plating cell 31 wherein a magnetic film with a lower anistropic field characteristic is applied to the wire. Finally, the wire is rinsed and heated as described by Toledo in the block 32 and taken up by the reel 33.

It was found to be critical that the chromium chloride layer be discontinuous in order to obtain the desired properties (there must be tight magnetic coupling between the permalloy layers, otherwise the operating range is lost). These small islands of chromium chloride form in the valleys of the irregular surface of the inner permalloy layer. In order to ensure that only a thin discontinuous film is formed over the inner permalloy layer the concentration of the solution, the rate at which the wire is pulled through chromium bath, and the length of the bath must be appropriately selected. By way of example only, a solution of 30 ± 10 grams of chromium chloride per liter of distilled water at ambient temperature (70° F) may be utilized, the wire may be pulled at a rate of 20 inches per minute, and the bath may be made 4 inches long.

Although the present invention has been disclosed in the context of an additional step in the process disclosed in U.S. Pat. No. 3,736,576, the present invention is not limited thereto. This step could be incorporated into any mated-wire process. It could also be utilized with equal facility in a mono-film process by plating only a portion of the single permalloy layer, adding the discontinuous layer of chromium chloride, and then plating the remaining portion of the single permalloy layer.

There is no minimum or maximum roughness limitation for the surface of the initial permalloy layer although the rougher this initial layer is the greater the operating margins obtained and thus the greater the advantage obtained from the invention.

The foregoing method is applicable for any high performance wire or flat film permalloy memory element for either military or commercial applications.

Obviously, many modifications and variations of the present invention are possible in light of the above teachings. It is therefore to be understood that, within the scope of the appended claims, the invention may be practiced otherwise than as specifically described.

What is claimed is:
1. A plated memory element comprising:
non-magnetic elongated substrate means;
first permalloy film means or a portion thereof forming a layer around said substrate means;
a thin discontinuous layer of chromium chloride overlaying said magnetic permalloy film means
second permalloy film means or the remaining portion of said first film means overlaying said discontinuous layer of chromium chloride.
2. A plated memory element as defined in claim 1, wherein said first permalloy film means is formed from a magnetic material with a relatively high anisotropic field characteristic;
and wherein said second permalloy film means is formed from a magnetic material with a low anisotropic filed characteristic relative to said first permalloy film means.
3. A plated memory element as defined in claim 1, wherein said first and second permalloy film means have a preferred direction of magnetization cirumferential to said elongated substrate means.
4. A plated-wire memory element with an inner and an outer permalloy layer, the improvement comprising:
a discontinuous film of chromium chloride between the inner and outer permalloy layers.

* * * * *